United States Patent
Baker

(10) Patent No.: US 6,236,184 B1
(45) Date of Patent: May 22, 2001

(54) VARIABLE SPEED COOLING FAN CONTROL

(75) Inventor: Roy Baker, Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 0 days.

(21) Appl. No.: 09/219,820

(22) Filed: Dec. 23, 1998

(51) Int. Cl.$^7$ .................................. H02P 5/34; H02P 7/42
(52) U.S. Cl. ..................... 318/803; 361/93.1; 361/93.7; 361/93.8; 318/806; 318/811
(58) Field of Search ...................... 318/803, 811, 318/254, 439, 138, 671, 599, 806, 798; 361/93.1, 103, 93.2–93.9

(56) References Cited

U.S. PATENT DOCUMENTS

| | | | |
|---|---|---|---|
| 3,059,164 | * 10/1962 | Johnson | 321/8 |
| 3,230,293 | 1/1966 | Turgeon | 174/16 |
| 4,267,500 | 5/1981 | Bourke et al. | 318/806 |
| 4,669,025 | * 5/1987 | Barker, III et al. | 361/103 |
| 4,691,274 | 9/1987 | Matouk et al. | 363/141 |
| 5,088,297 | * 2/1992 | Maruyama et al. | 62/228.4 |
| 5,210,684 | * 5/1993 | Nam | 363/37 |
| 5,291,383 | * 3/1994 | Oughton | 363/17 |
| 5,510,687 | * 4/1996 | Ursworth et al. | 318/727 |
| 5,587,641 | * 12/1996 | Rozman | 318/801 |
| 5,598,314 | * 1/1997 | Hall | 361/93 |
| 5,604,672 | * 2/1997 | Yoshida et al. | 363/97 |
| 5,723,968 | * 3/1998 | Sakurai | 318/802 |
| 5,952,812 | * 9/1999 | Maeda | 318/803 |
| 5,969,500 | * 10/1999 | Ishikawa et al. | 318/807 |
| 6,041,850 | * 3/2000 | Esser et al. | 165/104.33 |

FOREIGN PATENT DOCUMENTS 2-307320    12/1990    (JP).

* cited by examiner

Primary Examiner—Robert E. Nappi
Assistant Examiner—Edgardo San Martin
(74) Attorney, Agent, or Firm—Marshall O'Toole Gerstein Murray & Borun

(57) ABSTRACT

An AC to DC to AC converter has an input to receive input AC, a rectifier to rectify the input AC to DC, and an inverter to invert the DC to output AC. A load sensor senses load on the AC to DC to AC converter. A fan directs a cooling fluid to the AC to DC to AC converter. A fan control has an input coupled to the AC to DC to AC converter so as to receive DC therefrom, an input coupled to the load sensor, and an output coupled to the fan. The fan control controls the fan at a variable speed in response to load on the AC to DC to AC converter so as to vary the cooling fluid delivered by the fan to the AC to DC to AC converter.

22 Claims, 3 Drawing Sheets

VARIABLE SPEED COOLING FAN CONTROL

TECHNICAL FIELD OF THE INVENTION

The present invention relates to a variable speed cooling fan control particularly for use in cooling variable speed to constant frequency converters.

BACKGROUND OF THE INVENTION

Converters, such as variable speed to constant frequency converters which convert a variable speed mechanical input to a constant frequency electrical output, are typically required to handle large electrical power requirements. When such converters are required to operate in high load conditions, the converters can generate a substantial amount of heat which must be removed in order to protect the components of converters from damage. Accordingly, converters are cooled to prevent such damage.

For example, it is known to operate a fan at a constant speed in order to cool a converter. When a fan is operated at a constant speed to cool a converter, the fan must be run fast enough to cool the converter during the highest expected load condition. However, a fan running at high speed frequently entrains lint and other debris which tend to clog the cooling channels of the converter over time. As lint and debris build up in these cooling channels of a converter, both the cooling efficiency of the fan system and the life expectancy of the converter decrease.

One solution to this problem is to operate the fan at a speed that is dependant upon the load on the converter. Thus, at higher loads, the fan is run at a greater speed, and at lower loads, the fan is run at a slower speed. U.S. Pat. No. 3,059,164 discloses a variable speed fan control system for cooling a rectifier in response to load. However, the fan loads down the rectifier so that the fan unnecessarily contributes to the cooling needs of the rectifier.

U.S. Pat. No. 5,291,383 discloses a fan control system in which a cooling fan is run at a variable speed depending upon load as sensed at an input to an AC/DC/AC converter. Accordingly, the speed of the fan is not controlled directly by the load as sensed at the output of the converter but is controlled indirectly by sensing the input of the converter. This fan control introduces delay between changes in load and control of the fan.

The present invention is directed to a variable speed cooling fan control which solves one or more of the above noted problems.

SUMMARY OF THE INVENTION

According to one aspect of the present invention, a cooling system for a converter comprises a load sensor, a fan, and a fan control. The load sensor is arranged to sense load at an output of the converter. The fan is arranged to direct a cooling fluid to the converter, and the fan is arranged to receive electrical power upstream of the output of the converter. The fan control is coupled to the load sensor and to the fan, and the fan control is arranged to control the fan at a variable speed depending upon the sensed load.

According to another aspect of the present invention, a cooling system for a variable speed to constant frequency converter comprises a fan and a fan control. The fan is arranged to direct a cooling fluid to the variable speed to constant frequency converter. The fan control is coupled to the fan and is arranged to control the fan at a variable speed depending upon required cooling for the variable speed to constant frequency converter so as to vary cooling fluid delivered to the variable speed to constant frequency converter by the fan.

According to still another aspect of the present invention, a system comprises an AC to DC to AC converter, a load sensor, a fan, and a fan control. The AC to DC to AC converter has an input to receive input AC, a rectifier to rectify the input AC to DC, and an inverter to invert the DC to output AC. The load sensor is arranged to sense load on the AC to DC to AC converter. The fan is arranged to direct a cooling fluid to the AC to DC to AC converter. The fan control has first and second inputs, an inverter, and an output. The first input is coupled to the AC to DC to AC converter so as to receive DC therefrom, the second input is coupled to the load sensor, and the output is coupled to the fan.

The inverter is arranged to invert the DC on the first input to AC at the output as a function of the sensed load so as to control the fan at a variable speed in order to vary the cooling fluid delivered to the AC to DC to AC converter.

BRIEF DESCRIPTION OF THE DRAWING

These and other features and advantages of the present invention will become more apparent from a detailed consideration of the invention when taken in conjunction with the drawings in which.

DETAILED DESCRIPTION OF THE INVENTION

Figure 1:
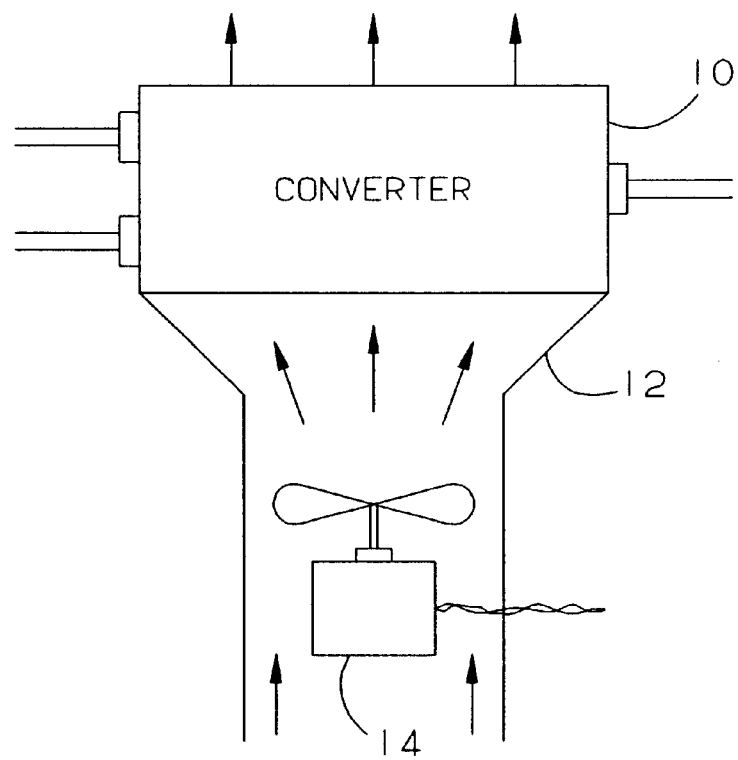
FIG. 1 illustrates a fan arranged to cool a converter in accordance with the present invention.

As shown in FIG. 1, a converter 10 is arranged to receive cooling air propelled through a cooling duct 12 by a fan 14. The converter 10 may be provided with cooling passages therethrough in order to increase the cooling efficiency of the cooling air flowing through the cooling duct 12.

Figure 2:
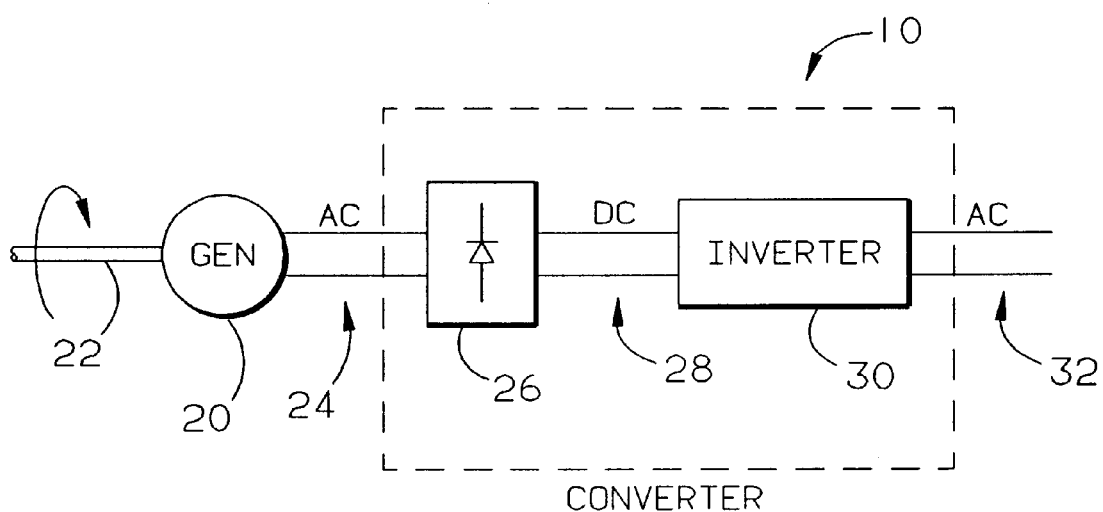
FIG. 2 illustrates an exemplary converter which can be used for the converter of FIG. 1.

An example of a converter which can be used for the converter 10 is illustrated in FIG. 2. A generator 20, which may be driven by an input drive shaft 22, generates AC at an AC output 24. The input drive shaft 22 may be driven, for example, by an engine of an aircraft which has a variable speed. Because of this variable speed, the frequency of the AC on the AC output 24 varies. The converter 10 is arranged to convert the variable speed of the input drive shaft 22 to a constant frequency AC output. Accordingly, the AC on the AC output 24 is rectified by a rectifier 26 in order to produce DC on DC rails 28. An inverter 30 inverts the DC on the DC rails 28 to AC on an AC output 32. The inverter 30 may be controlled so that the AC on the AC output 32 has a constant frequency.

Figure 3:
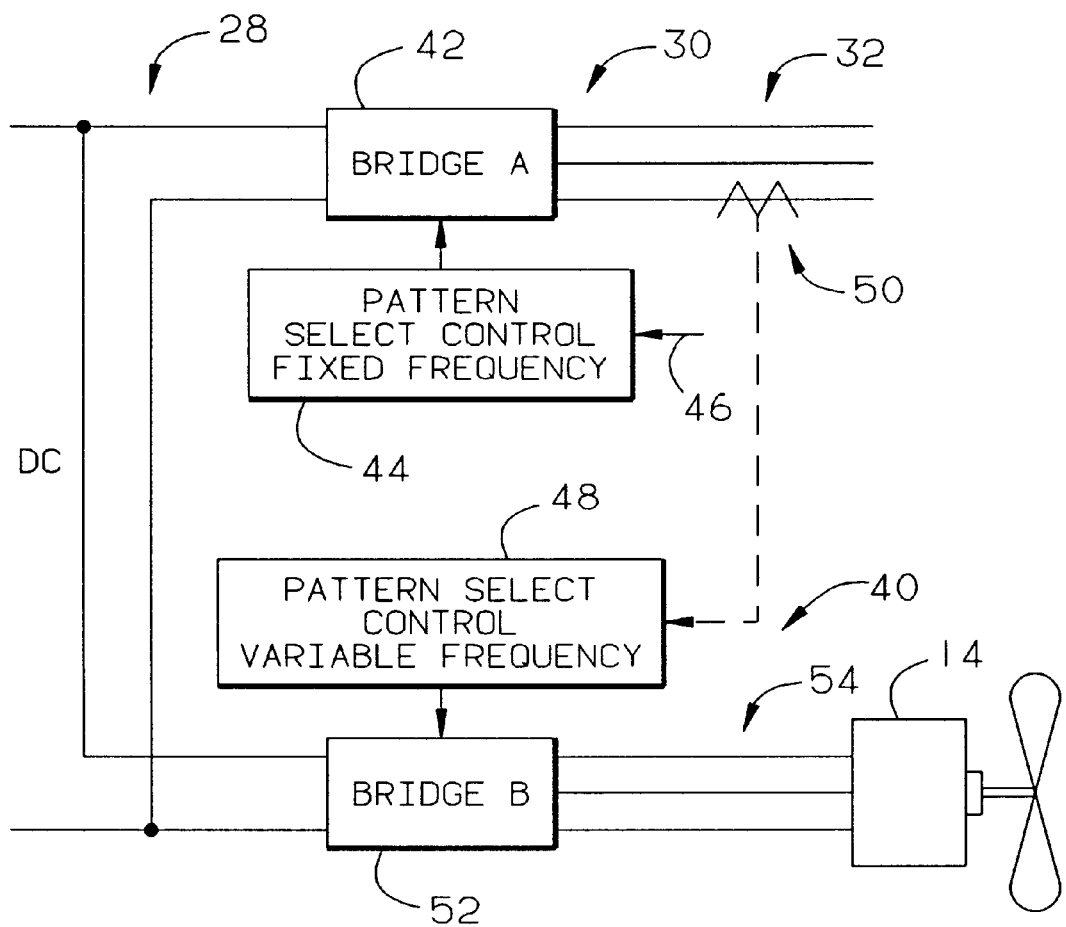
FIG. 3 illustrates an exemplary fan control which can be used to control the fan of FIG. 1 in accordance with the present invention; and, FIG. 4 illustrates an exemplary bridge which can be used for the bridges of FIG. 3.

As shown by way of example in FIG. 3, the inverter 30 includes a switching bridge 42 having switches which are connected to the DC rails 28 and which are controlled by a pattern select control 44 in order to produce constant frequency multi-phase AC on the AC output 32. For example, the AC on the AC output 32 may be three-phase AC. The pattern select control 44 may include a look up table that stores predetermined pulse width modulating (PWM)

switching patterns each of which is addressed in accordance with one or more feedbacks 46. Each selected PWM switching pattern is supplied to the switches of the switching bridge 42 in order to control these switches in a PWM manner so as to provide a constant frequency AC output on the AC output 32 and to accomplish such other objectives as harmonic control, amplitude control, and the like.

A fan control 40, which is also illustrated in FIG. 3, controls the fan 14 at a variable speed in accordance with the load on the converter 10. Therefore, when the load on the converter 10 is high so that the converter 10 is generating substantial heat, the fan 14 is driven at a higher rate of speed in order to deliver more cooling to the converter 10. On the other hand, when the load on the converter 10 is low so that the converter 10 is generating less heat, the fan 14 is driven at a lower rate of speed in order to deliver less cooling to the converter 10.

The fan control 40 includes, for example, a pattern select control 48. The pattern select control 48 may include a look up table which stores predetermined PWM switching patterns and is addressed in accordance with the load on the inverter 30 as sensed by a load sensor 50. The load sensor 50, for example, may be a current sensor that senses the current in at least one of the phases of the AC output 32.

The PWM switching patterns as addressed by the load on the inverter 30 are supplied from the look up table of the pattern select control 48 to the switches of a switching bridge 52 in order to control these switches in a PWM manner so as to convert DC from the DC rails 28 to AC. The PWM switching patterns are arranged so that, as they are addressed by the load on the inverter 30, they operate the switches of the switching bridge 52 in order to provide an AC output on an AC output 54 having a frequency appropriate to the load. Thus, as the load increases on the converter 10, the frequency of the AC output on the AC output 54 increases to drive the fan 14 at a faster rate in order to deliver more cooling to the converter 10. Similarly, as the load decreases, the frequency of the AC output on the AC output 54 decreases to drive the fan 14 at a slower rate in order to deliver less cooling to the converter 10.

Figure 4:
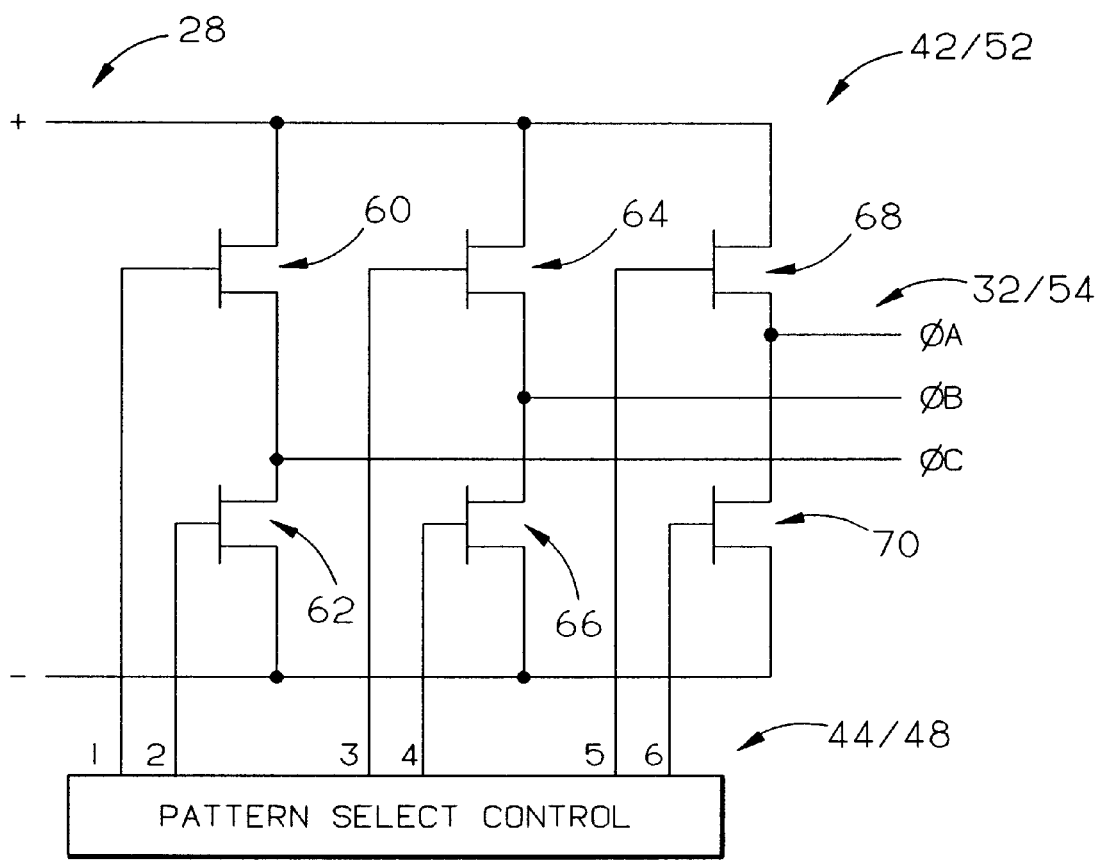

FIG. 4 illustrates a bridge which can be used for the switching bridge 42 and for the switching bridge 52. The bridge illustrated in FIG. 4 includes switching transistors 60, 62, 64, 66, 68, and 70. The switching transistors 60 and 62 are connected in series across the DC rails 28, the switching transistors 64 and 66 are connected in a series across the DC rails 28, and the switching transistors 68 and 70 are connected in a series across the DC rails 28. The control electrodes of the switching transistors 60, 62, 64, 66, 68, and 70 are driven by the pattern select control 44 or 48 as described above in order to provide either a constant frequency output in the case of the switching bridge 42 or a variable frequency output in the case of the switching bridge 52.

The common junction between the switching transistors 68 and 70 provides phase A of the AC output 32 or 54, the common junction between the switching transistors 64 and 66 provides phase B of the AC output 32 or 54, and the common junction between the switching transistors 60 and 62 provides phase C of the AC output 32 or 54.

Certain modifications of the present invention have been discussed above. Other modifications will occur to those practicing in the art of the present invention. For example, as described above, the inverter 30 and the fan control 40 comprise switching transistor bridges and pattern select controls. Instead, the inverter 30 and the fan control 40 may comprise other types of inverters and controls.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A cooling system for a variable speed to constant frequency converter comprising:

a load sensor arranged to sense load at an output of the variable speed to constant frequency converter;

a cooling fluid drive arranged to direct a cooling fluid to the variable speed to constant frequency converter; and, a control coupled to the cooling fluid drive, wherein the control is arranged to control the cooling fluid drive at a variable speed depending upon the load sensed by the load sensor so as to vary cooling fluid delivered to the variable speed to constant frequency converter by the cooling fluid drive.

2. The cooling system of claim 1 wherein the control is coupled to the load sensor and to the cooling fluid drive and wherein the control is arranged to control the cooling fluid drive at a variable speed depending upon the sensed load so as to vary cooling fluid delivered to the variable speed to constant frequency converter as function of load on the variable speed to constant frequency converter.

3. The cooling system of claim 2 wherein the control is arranged to provide an output having a frequency dependent upon the sensed load.

4. The cooling system of claim 2 wherein the load sensor comprises a current sensor arranged to sense an output current of the variable speed to constant frequency converter.

5. The cooling system of claim 4 wherein the control is arranged to provide an output having a frequency dependent upon the sensed load.

6. The cooling system of claim 2 wherein the control comprises a PWM control.

7. The cooling system of claim 6 wherein the PWM control includes a plurality of stored PWM patterns, wherein the stored PWM patterns are selected as a function of the sensed load, and wherein the stored PWM patterns are arranged to vary a frequency of an output of the fan control dependent upon the sensed load.

8. The cooling system of claim 7 wherein the load sensor comprises a current sensor arranged to sense an output current of the variable speed to constant frequency converter.

9. The cooling system of claim 1 wherein the control is arranged to provide an output having a variable frequency so as to the drive the fan at the variable speed.

10. The cooling system of claim 1 wherein the control comprises a PWM control.

11. The cooling system of claim 10 wherein the PWM control includes a plurality of stored PWM patterns, wherein the stored PWM patterns are selected as a function of required cooling, and wherein the stored PWM patterns are arranged to vary a frequency of an output of the control so as the vary the speed of the cooling fluid drive.

12. A system comprising:

an AC to DC to AC converter having an input to receive input AC, a rectifier to rectify the input AC to DC, and an inverter to invert the DC to output AC;

a load sensor arranged to sense load on the AC to DC to AC converter;

a fan arranged to direct a cooling fluid to the AC to DC to AC converter; and, a fan control having first and second inputs, an inverter, and an output, wherein the first input is coupled to the AC to DC to AC converter so as to receive DC therefrom, wherein the second input is coupled to the load sensor, wherein the output is coupled to the fan, and wherein the inverter is arranged to invert the DC on the first input to AC at the output as a function of the sensed load so as to control the fan at a variable speed in order to vary the cooling fluid delivered to the AC to DC to AC converter.

13. The system of claim 12 wherein the inverter is arranged to invert the DC to a variable frequency output, and wherein the variable frequency output is supplied to the fan so as to drive the fan at a variable speed.

14. The cooling of claim 12 wherein the inverter is arranged to provide an output having a frequency dependent upon the sensed load on the AC to DC to AC converter.

15. The cooling of claim 12 wherein the load sensor comprises a current sensor arranged to sense an output current of the AC to DC to AC converter.

16. The cooling system of claim 15 wherein the inverter is arranged to provide an output having a frequency dependent upon the sensed load on the AC to DC to AC converter.

17. The system of claim 12 wherein the fan control includes a plurality of stored PWM patterns, wherein the stored PWM patterns are selected as a function of the sensed load, and wherein the stored PWM patterns are arranged to control the inverter so as to vary a frequency of the output of the fan control dependent upon the sensed load.

18. The cooling system of claim 17 wherein the load sensor comprises a current sensor arranged to sense an output current of the AC to DC to AC converter.

19. The cooling of claim 12 wherein the fan control comprises a PWM fan control.

20. The cooling system of claim 1 wherein the cooling fluid drive is a fan.

21. The system of claim 12 wherein the load is electrical load.

22. The system of claim 21 wherein the electrical load is current.

* * * * *